United States Patent
Ningaraju et al.

(10) Patent No.: US 10,020,392 B2
(45) Date of Patent: Jul. 10, 2018

(54) DIODE, JUNCTION FIELD EFFECT TRANSISTOR, AND SEMICONDUCTOR DEVICE

(71) Applicant: Nuvoton Technology Corporation, Hsinchu (TW)

(72) Inventors: Vivek Ningaraju, Hsinchu (TW); Po-An Chen, Hsinchu (TW); Vinay Suresh, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/269,996

(22) Filed: Sep. 20, 2016

(65) Prior Publication Data
US 2018/0069116 A1    Mar. 8, 2018

(30) Foreign Application Priority Data
Sep. 2, 2016    (TW) .............................. 105128522 A

(51) Int. Cl.
| H01L 29/66  | (2006.01) |
| H01L 29/78  | (2006.01) |
| H01L 29/40  | (2006.01) |
| H01L 29/861 | (2006.01) |

(52) U.S. Cl.
CPC ........ *H01L 29/7819* (2013.01); *H01L 29/402* (2013.01); *H01L 29/408* (2013.01); *H01L 29/8618* (2013.01)

(58) Field of Classification Search
CPC .......................... H01L 29/7835; H01L 29/402; H01L 29/0634
USPC ......................................................... 257/341
See application file for complete search history.

(56) References Cited

U.S. PATENT DOCUMENTS

| 4,074,293 | A | 2/1978 | Kravitz |
| 9,269,704 | B2 * | 2/2016 | Chen .................... H01L 29/7436 |
| 2002/0030225 | A1 * | 3/2002 | Nakamura .......... H01L 29/0615 257/338 |
| 2002/0130361 | A1 * | 9/2002 | Imam .................. H01L 29/0634 257/341 |
| 2004/0108544 | A1 * | 6/2004 | Hossain .............. H01L 29/0847 257/328 |

(Continued)

FOREIGN PATENT DOCUMENTS

| WO | 2016071969 | 5/2016 |
| WO | 2016194216 | 12/2016 |

OTHER PUBLICATIONS

Zhu et al., "An Integrated Bootstrap Diode Emulator for 600-V High Voltage Gate Drive IC with P-Sub/P-Epi Technology", IEEE Transactions on Power Electronics, Jan. 2016, pp. 518-523.

(Continued)

*Primary Examiner* — David Vu
*Assistant Examiner* — Brandon Fox
(74) *Attorney, Agent, or Firm* — JCIPRNET

(57) ABSTRACT

Provided are a diode, a junction field effect transistor (JFET), and a semiconductor device that have a top doped region. A dopant concentration gradient of the top doped region at one side is different from the dopant concentration gradient of the top doped region at an opposite side. The top doped region is able to increase a breakdown voltage of the device and decrease an on-state resistance (Ron) of the device.

12 Claims, 6 Drawing Sheets

(56) References Cited

U.S. PATENT DOCUMENTS

| | | | |
|---|---|---|---|
| 2005/0062102 A1* | 3/2005 | Dudek | H01L 29/0653 |
| | | | 257/335 |
| 2006/0157818 A1 | 7/2006 | Williams et al. | |
| 2012/0104468 A1 | 5/2012 | Li et al. | |
| 2015/0028351 A1 | 1/2015 | Van Brunt et al. | |

OTHER PUBLICATIONS

Kim et al., "JFET Pinched Bootstrap Diode (JPBD) without Substrate Leakage Current Integration to 120V BCDMOS Process", 2013 25th International Symposium on Power Semiconductor Devices and ICs (ISPSD), May 26-30, 2013, pp. 135-138.
"Office Action of Taiwan Counterpart Application," dated Apr. 20, 2017, p. 1-p. 4.

* cited by examiner

DIODE, JUNCTION FIELD EFFECT TRANSISTOR, AND SEMICONDUCTOR DEVICE

CROSS-REFERENCE TO RELATED APPLICATION

This application claims the priority benefit of Taiwan application Ser. No. 105128522, filed on Sep. 2, 2016. The entirety of the above-mentioned patent application is hereby incorporated by reference herein and made a part of this specification.

BACKGROUND OF THE INVENTION

1. Field of the Invention

The present disclosure relates to an integrated circuit, and particularly relates to a diode, a junction field effect transistor, and a semiconductor device.

2. Description of Related Art

Generally speaking, a high voltage integrated circuit is mainly applied in a power switch circuit, such as a power switch in various power management apparatuses. Currently, the power switches are mainly subject to two parameters, which are breakdown voltage and ON-state resistance, and the parameters may be set based on different needs. Meanwhile, the main purpose of designing a high voltage integrated circuit is to reduce the ON-state resistance and keep a high breakdown voltage. In fact, if the designer intends to meet the specification requirement of breakdown voltage, the ON-state resistance is often sacrificed. Thus, the breakdown voltage and the ON-state resistance are in a trade-off relation.

A high voltage integrated circuit includes a high voltage device region and a low voltage device region. In the operation of the high voltage integrated circuit, the voltage of the high voltage device region needs to be quickly switched between 0 to 600 volts or higher. The high voltage device region may be operated with power supply from a bootstrap circuit, and the bootstrap circuit may include a bootstrap diode, a bootstrap capacitor, a bootstrap transistor, or other devices.

However, it is still challenging to integrate the whole bootstrap circuit into the conventional integrated circuit manufacturing process while maintaining a charge balance in the high voltage device region, so as to improve the product reliability.

SUMMARY OF THE INVENTION

The present disclosure provides a diode, a junction field-effect transistor, and a semiconductor that have a top doped region. The diode, the junction field-effect transistor, and the semiconductor according to the embodiments of the present disclosure are capable of maintaining a charge balance in the diode, the junction field effect transistor, and the semiconductor device, so as to increase the reliability of the product.

A diode according to an embodiment of the present disclosure includes a cathode of a first conductivity type, an anode of a second conductivity type, and a top doped region of the second conductivity type. The cathode is located in a substrate. The anode is located in the substrate and surrounds the cathode. The top doped region is located in the substrate between the cathode and the anode. The top doped region has a dopant concentration gradient. The dopant concentration gradient of the top doped region near the anode is different from the dopant concentration gradient of the top doped region near the cathode.

A junction field effect transistor according to an embodiment of the present disclosure includes a substrate of a second conductivity type, a well region of a first conductivity type, and a top doped region of the second conductivity type. The well region is located in a substrate. The top doped region is located in the well region. The top doped region has a dopant concentration gradient. The dopant concentration gradient of the top doped region at a first side is different from the dopant concentration gradient of the top doped region at a second side.

A semiconductor device according to an embodiment of the present disclosure includes a high voltage device and a junction field effect transistor embedded in the high voltage device. The high voltage device includes a substrate of a second conductivity type, a drain region of a first conductivity type, a source region of the first conductivity type, a gate structure, and a first top doped region of the second conductivity type. The drain is located in a substrate. The source is located in the substrate and surrounds the drain. The gate structure is located over the substrate between the drain region and the source region. The first top doped region is located in the substrate between the drain region and the gate structure. The first top doped region has a first dopant concentration gradient. The first dopant concentration gradient of the first top doped region near the gate structure is different from the first dopant concentration gradient of the first top doped region near the drain region. The junction field effect transistor includes a well region of the first conductivity type and a second top doped region of the second conductivity type. The well region is located in a substrate. The second top doped region is located in the well region.

A semiconductor device according to an embodiment of the present disclosure includes a substrate and a metal oxide semiconductor field effect transistor. The substrate has a high voltage device region, a low voltage device region, a termination region, and an isolation region. The termination region is located between the high voltage device region and the low voltage device region and surrounds the high voltage device region. The metal oxide semiconductor field effect transistor includes a drain region of a first conductivity type, a source region of the first conductivity type, a gate structure, and a top doped region of a second conductivity type. The drain is located in the substrate and near the isolation region, wherein the isolation region is located between the drain region and the high voltage device region. The source is located in the substrate and near the low voltage device region. The gate structure is located over the substrate between the drain region and the source region. The top doped region is located in the substrate between the drain region and the gate structure. The top doped region has a dopant concentration gradient. The dopant concentration gradient of the top doped region near the gate structure is different from the first dopant concentration gradient of the first top doped region near the drain region.

Based on above, different dopant concentration gradients are designed for the diode, junction field effect transistor, and semiconductor device according to the embodiments of the present disclosure based on the different top doped regions, so as to prevent current accumulation in the device and thereby increase the breakdown voltage and reduce the ON-state resistance of the device. In addition, the embodiments of the present disclosure include the metal interconnects over the top doped region to prevent passivation or process contaminations, so as to increase the reliability of the device. The metal interconnect may also serve as a field plate capable of reducing the surface field to effectively reduce the ON-state resistance.

Moreover, according to the embodiments of the present disclosure, a bootstrap circuit may be integrated into the conventional integrated circuit manufacturing process without modifying the conventional process or adding a photomask. Also, a charge balance in the high voltage device is maintained and the breakdown voltage of the high voltage device is increased. Accordingly, the reliability of the device is thus increased.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
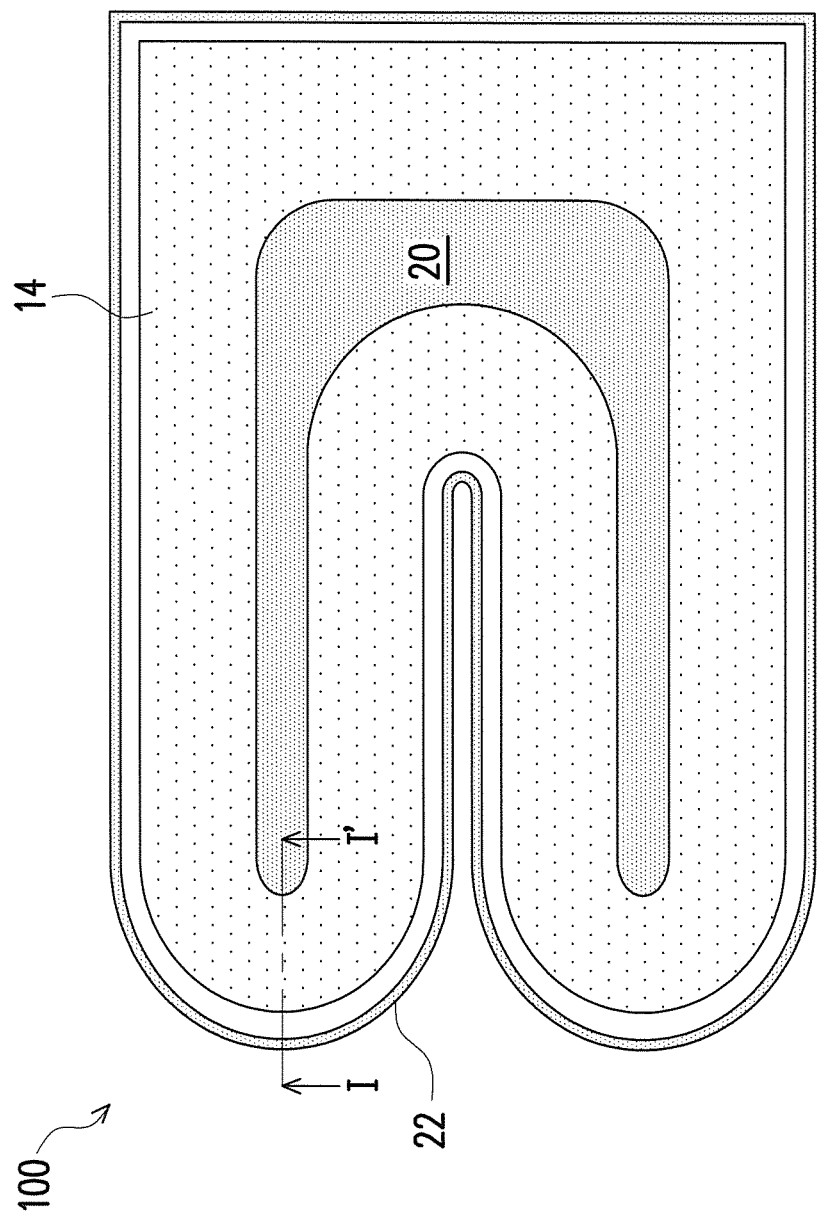
FIG. 1 is a top view illustrating a diode according to a first embodiment of the present disclosure.

Reference will now be made in detail to the present preferred embodiments of the present disclosure, examples of which are illustrated in the accompanying drawings. Wherever possible, the same reference numbers are used in the drawings and the description to refer to the same or like parts.

In the following embodiments, the first conductivity type differs from the second conductivity type. In an embodiment, the first conductivity type is N-type, while the second conductivity type is P-type. In another embodiment, the first conductivity type is P-type, and the second conductivity type is N-type. A P-type dopant is boron, for example, and an N-type dopant is phosphorus or arsenic, for example. In this embodiment, the first conductivity type is N-type, and the second conductivity type is P-type, for example. However, the present disclosure is not limited thereto.

Figure 2:
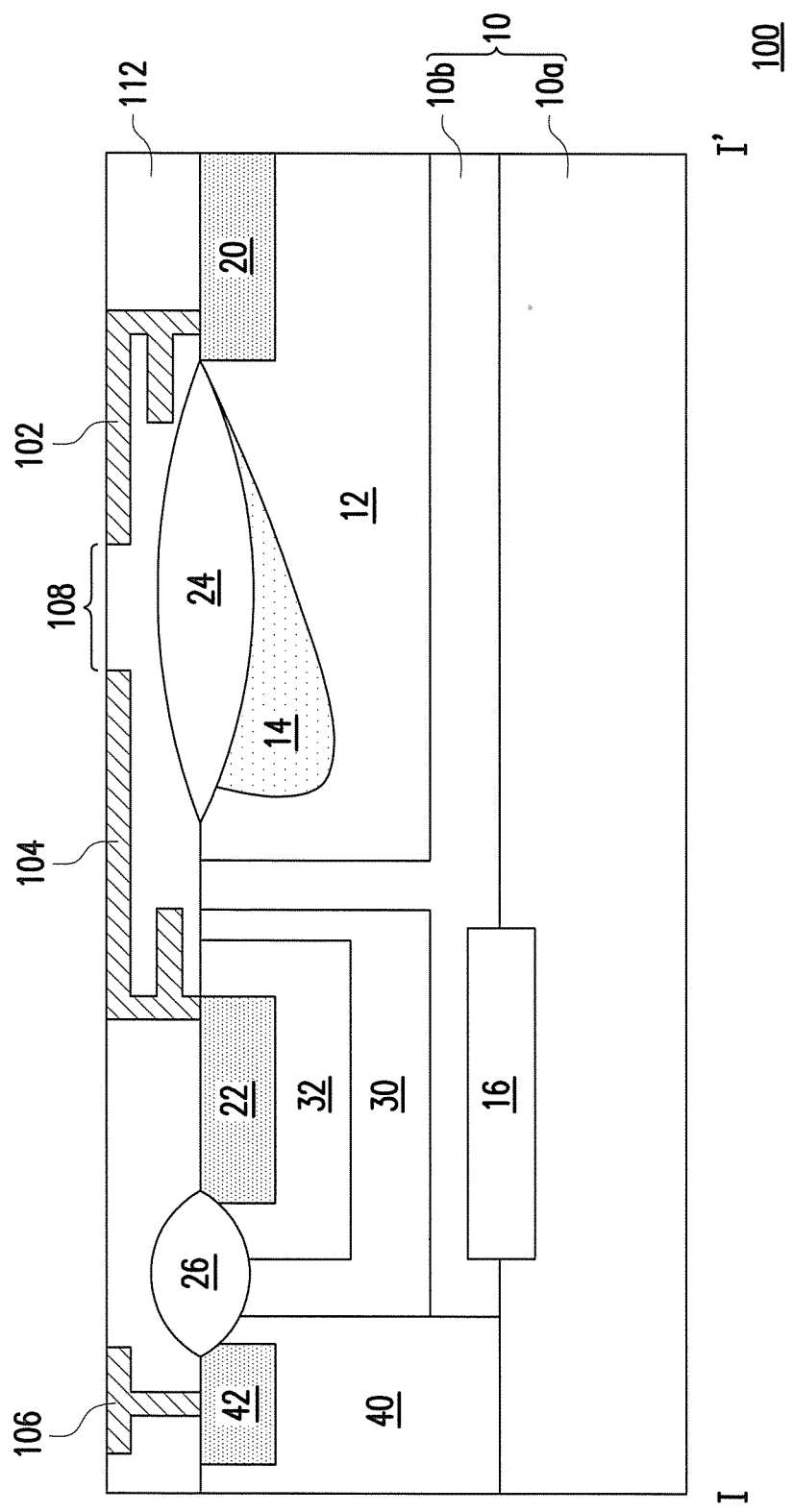
FIG. 2 is a cross-sectional view taken along a cross-sectional line I-I' of FIG.

FIG. 1 is a top view illustrating a diode according to a first embodiment of the present disclosure. FIG. 2 is a cross-sectional view taken along a cross-sectional line I-I' of FIG. 1. For the ease of illustration, only a source, a drain, and a top doped region are illustrated in FIG. 1.

Referring to FIGS. 1 and 2, generally speaking, a diode device differs from a triode device in that the diode device does not include a gate structure. In the first embodiment of the present disclosure, the diode 100 includes a cathode 20, an anode 22, and a top doped region 14. The cathode 20, the anode 22, and the top doped region 14 are all located in the substrate 10. In another embodiment, the diode 100 may further include a first doped region 12, a second doped region 30, and a third doped region 32.

The substrate 10 may be a semiconductor substrate 10, such as a silicon substrate. The substrate 10 may be doped with a P-type dopant or an N-type dopant. The P-type dopant may be ions of Group IIIA elements, such as boron ions. The N-type dopant may be ions of Group VA elements, such as arsenic ions or phosphorus ions. In another embodiment, the substrate 10 may also include a semiconductor substrate 10a and an epitaxial layer 10b over the semiconductor substrate 10a. In this embodiment, the semiconductor substrate 10a is a P-type substrate, and the epitaxial layer 10b may be an N-type epitaxial (N-epi) layer.

The first doped region 12 is of the first conductivity type and is located in the substrate 10, and the top doped region 14 and the cathode 20 are located in the first doped region 12. In an embodiment, the first doped region 12 may be a deep N-type well region, for example.

The cathode 20 is of the first conductivity type and located in the first doped region 12. A dopant concentration of the cathode 20 is higher than a dopant concentration of the first doped region 12. A shape of a projection of the cathode 20 onto a surface of the substrate 10 at least includes a U-shape. In another embodiment, the shape of the projection of the cathode 20 onto the surface of the substrate 10 may include two or more U-shapes or include other shapes. The present disclosure does not intend to impose a limitation in this regard.

The second doped region (e.g., a high voltage N-type well, HVNW) 30 is of the first conductivity type and located in the substrate 10. The second doped region 30 is near the first doped region 12. The third doped region (e.g., a P-type well region) 32 and the anode 22 are located in the second doped region 30. The third doped region 32 is of the second conductivity type and located in the second doped region 30. In an embodiment, the second doped region 30 is a HVNW region, whereas the third doped region 32 is a P-type well (PW) region.

The anode 22 is of the second conductivity type and located in the third doped region 32. A dopant concentration of the anode 22 is higher than a dopant concentration of the third doped region 32. According to the top view of FIG. 1, the anode 22 surrounds the cathode 20. More specifically, the anode 22 surrounds a circumference of the top doped region 14.

In an embodiment, the cathode 20 and the anode 22 are separated from each other with an isolation structure (also referred to as a drift isolation structure) 24. The isolation structure 24 biases a position with a maximum electric field intensity in an electric field formed between the cathode 20 and the anode 22 toward a lower side of the isolation structure, instead of being located in the cathode 20 or the anode 22, so as to make the electrical field more dispersed. The isolation structure 24 may be a localized thermally oxidized isolation structure, for example, and a material of the isolation structure 24 includes an insulating material, such as silicon oxide.

From a perspective, such as a lateral perspective, the top doped region 14 is of the second conductivity type and located in the first doped region 12 (or the substrate 10)

between the cathode 20 and the anode 22. From another perspective, such as a vertical perspective, the top doped region 14 is located between the isolation structure 24 and the first doped region 12 (or the substrate 10). In an embodiment, a dopant concentration gradient of the top doped region 14 near the anode 22 is different from the dopant concentration gradient of the top doped region 14 near the cathode 20. Specifically, the dopant concentration gradient in the top doped region 14 may be linear. Namely, the dopant concentration of the top doped region 14 linearly decreases from near the anode 22 toward near the cathode 20. From another perspective, a doped depth of the top doped region 14 gradually decreases from near the anode 22 to near the cathode 20. A profile of the bottom of the top doped region 14 is substantially linear.

In this embodiment, by adjusting the dopant concentration gradient of the top doped region 14, an electric field distribution in the device may become more uniform, so as to increase a breakdown voltage of the device. In addition, the top doped region 14 of this embodiment may also reduce positive charges in a drift region (i.e., a region in the substrate 10 between the anode 22 and the cathode 20), so as to reduce an ON-state resistance. Moreover, compared with a top doped region with uniform dopant concentration and depth, the dopant concentration gradient of the top doped region 14 is adjusted, so as to reduce a length of the isolation structure 24 and thereby achieve the same breakdown voltage. Thus, the diode 100 of this embodiment may have a greater chip area available for use.

Besides, in some embodiment, the substrate 10 of the diode 100 may further include a fourth doped region 40, a fifth doped region 42, and a buried layer 16 (shown in FIG. 2) of the first conductivity type. The fourth doped region 40 is of the second conductivity type and surrounds the second doped region 30. The fifth doped region 42 is of the second conductivity type and located in the fourth doped region 40. An isolation structure 26 may be provided between the anode 22 and the fifth doped region 42.

The buried layer 16 (e.g., an N-type buried layer) is located below the anode 22 and between the semiconductor substrate 10a and the epitaxial layer 10b, and is capable of preventing a leakage current from flowing into the semiconductor substrate 10a.

In addition, the diode 100 further includes metal interconnects 102, 104, and 106 located in a dielectric layer 112. More specifically, the metal interconnect 102 is located over the substrate 10 between the cathode 20 and the anode 22 and electrically connected with the cathode 20. The metal interconnect 104 is located over the substrate 10 between the cathode 20 and the anode 22 and electrically connected with the anode 22. The metal interconnect 106 is located over the fifth doped region 42 and electrically connected with the fifth doped region 42. In this embodiment, the metal interconnects 102 and 104 cover a portion of the isolation structure 24 to prevent passivation and process contaminations, so as to thereby increase the reliability of the device. At least one opening 108 is provided between the metal interconnect 102 and the metal interconnect 104. The opening 108 is located over the top doped region 14. Moreover, in addition to serving as metal interconnects, the metal interconnects 102 and 104 over the isolation structure 24 may also serve as a field plate or a shielding layer. Thus, the metal interconnects 102 and 104 located over the isolation structure 24 may reduce a surface field to effectively increase the breakdown voltage and reduce the ON-state resistance. In an embodiment, the user may adjust the size of the opening 108 over the top doped region 14 based on needs, so as to optimize the breakdown voltage and the ON-state resistance of the device. Even though the metal interconnects 102, 104, and 108 only include two conductive layers, the present disclosure is not limited thereto. In other embodiments, the metal interconnects 102, 104, and 108 may also include one conductive layer or multiple conductive layers.

In an embodiment, a material of the dielectric layer 112 may include tetra-ethyl-ortho-silicate (TEOS) silicon oxide, boron phosphate silicate glass (BPSG), phosphate silicate glass (PSG), hydrogen silsesquioxane (HSQ), fluorosilicate glass (FSG), undoped silicon glass (USG), silicon nitride, silicon oxynitride, a low dielectric constant material with a dielectric constant lower than 4, or a combination thereof, for example.

Figure 3:
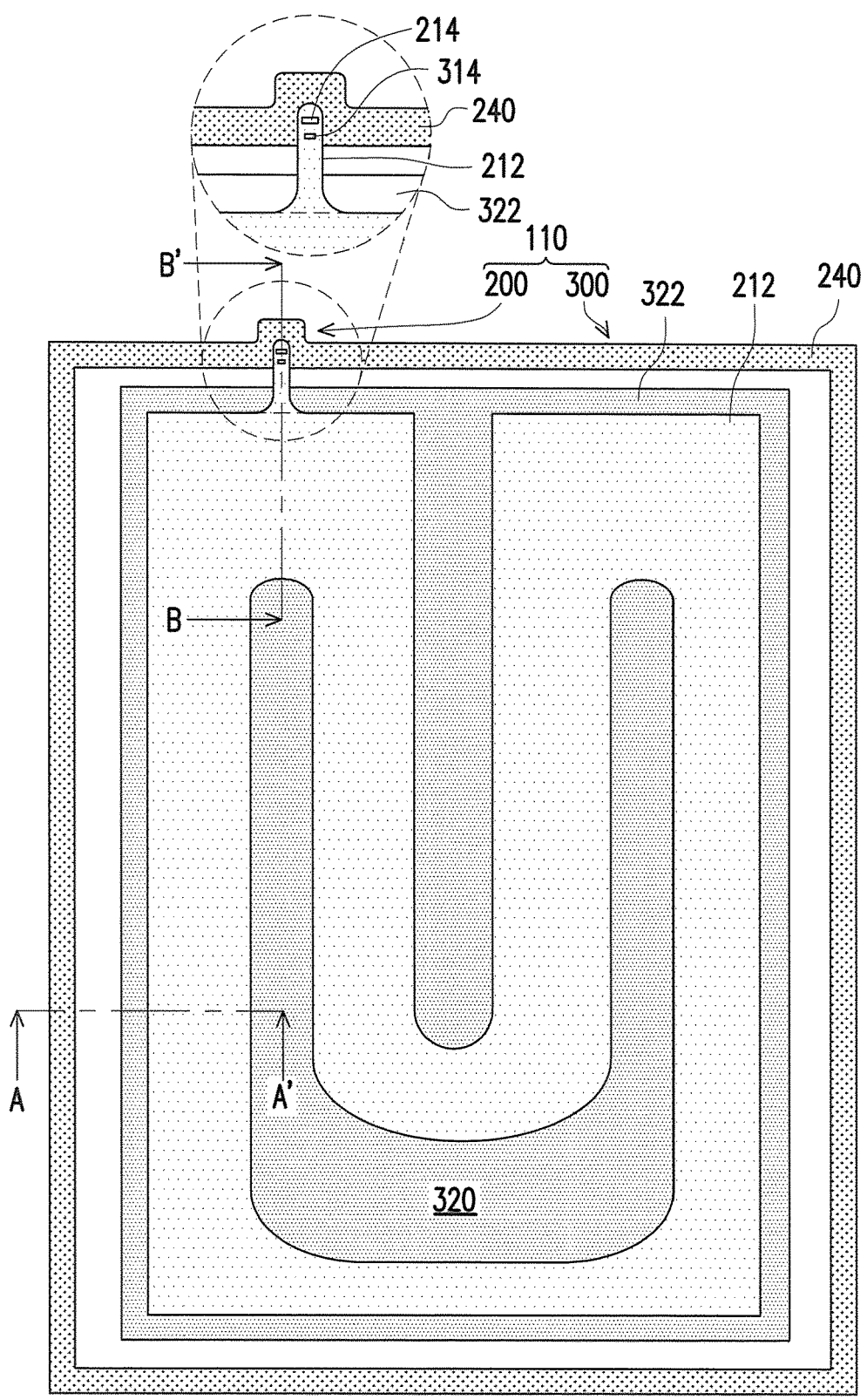
FIG. 3 is a top view illustrating a semiconductor device according to a second embodiment of the present disclosure.
Figure 4A:
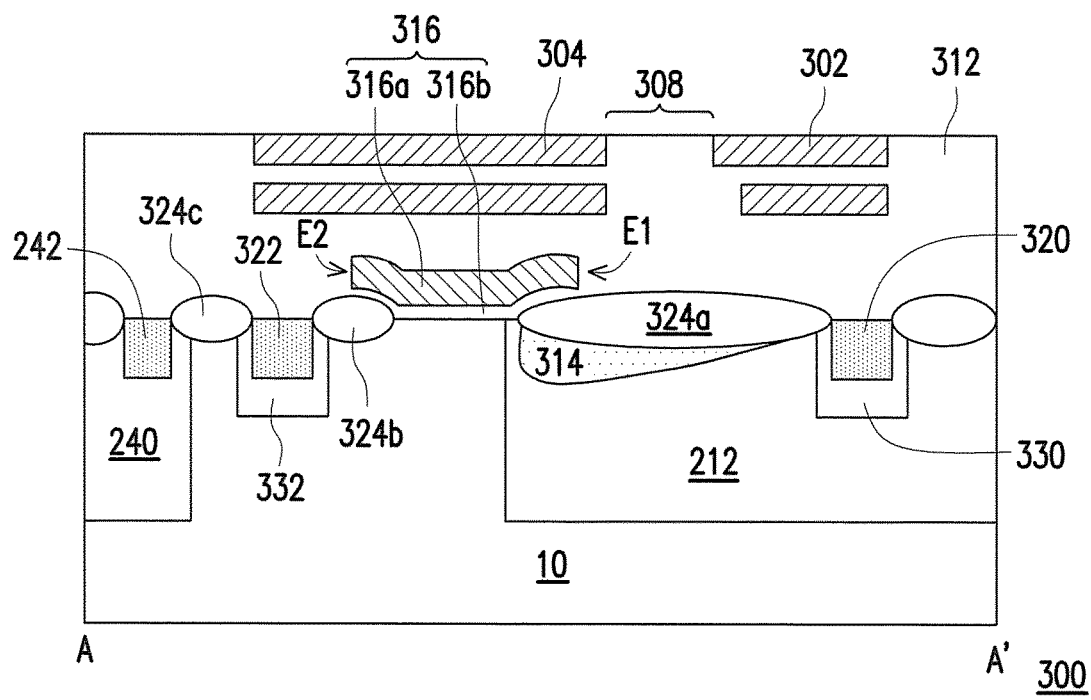
FIG. 4A is a cross-sectional view taken along a cross-sectional line A-A' of FIG. 3.
Figure 4B:
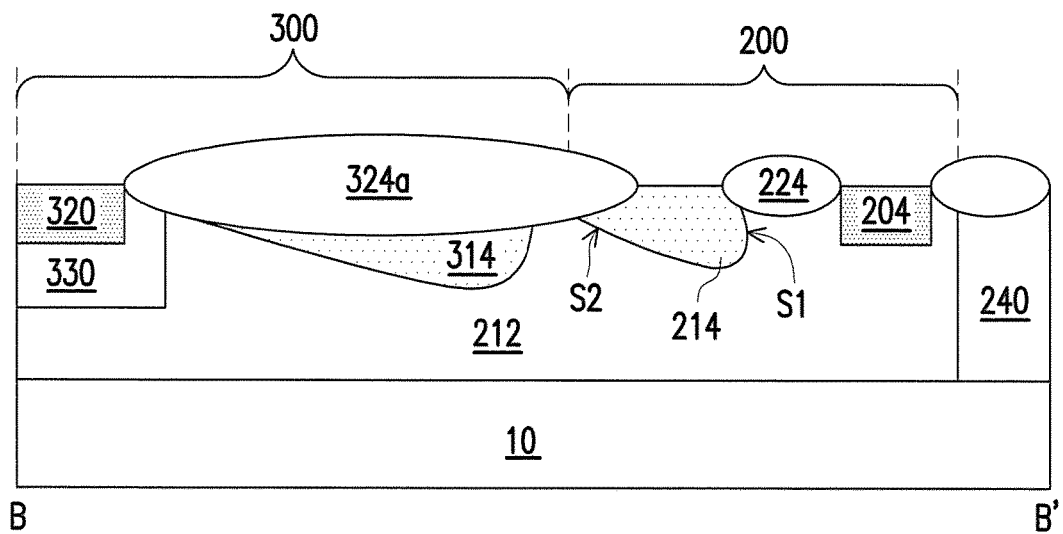
FIG. 4B is a cross-sectional view taken along a cross-sectional line B-B' of FIG. 3.

FIG. 3 is a top view illustrating a semiconductor device according to a second embodiment of the present disclosure. FIG. 4A is a cross-sectional view taken along a cross-sectional line A-A' of FIG. 3. FIG. 4B is a cross-sectional view taken along a cross-sectional line B-B' of FIG. 3. For the ease of illustration, FIG. 3 only illustrates a junction field effect transistor, a high voltage device, a first doped region, a fourth doped region, a first top doped region, a second top doped region, the drain, and the source.

Referring to FIGS. 3, 4A, and 4B, in the second embodiment, a semiconductor device 110 includes a high voltage device 300 and a junction field effect transistor (JFET) 200 embedded into the high voltage device 300.

Referring to FIGS. 3 and 4A, in an embodiment, the high voltage device 300 includes the substrate 10, a drain 320, a source 322, a gate structure 316, and a first top doped region 314. In another embodiment, the high voltage device 300 may further include a first doped region 212, a second doped region 330, and a third doped region 332.

The first doped region 212 is of the first conductivity type and is located in the substrate 10, and the first top doped region 314, the second doped region 330, and the drain 320 are located in the first doped region 212. In an embodiment, the first doped region 212 is a first N-type well region, for example. In an exemplary embodiment, the first doped region 212 is a deep N-type well region, for example.

The second doped region 330 is of the first conductivity type, and located in the first doped region 212. The drain 320 is located in the second doped region 330. The second doped region 330 is a combination of one or more doped regions, for example. In an embodiment, the second doped region 330 is an N-type heavily doped drain (NHDD), for example.

The drain 320 is of the first conductivity type and located in the second doped region 330. A dopant concentration of the drain 320 is higher than a dopant concentration of the second doped region 330. A shape of a projection of the drain 320 onto the surface of the substrate 10 at least includes a U-shape. In another embodiment, the shape of the projection of the drain 320 onto the surface of the substrate 10 may include two or more U-shapes or include other shapes. The present disclosure does not intend to impose a limitation in this regard.

The gate structure 316 includes a gate electrode 316a and a gate dielectric layer 316b located below the gate electrode 316a. The gate structure 316 is located over the substrate 10 between the source 322 and the drain 320. More specifically, in an embodiment, an end E1 of the gate structure 316 extends toward a direction of the drain 320, and covers a portion of the first doped region 212, a portion of an isolation structure 324a, and a portion of the first top doped region 314. Another end E2 of the gate structure 316 extends toward a direction of the source 322, and covers a portion of an isolation structure 324b. In an embodiment, the gate structure 316 and the first top doped region 314 are separated by the isolation structure (also referred to as a drift isolation structure) 324a. With the gate structure 316 covering the portion of the isolation structure 324a, a position with a maximum electric field intensity in an electric field formed between the drain 320 and the source 322 is biased toward a lower side of the isolation structure 324a, instead of being located below the gate dielectric layer 316b, so as to prevent the thinner gate dielectric layer 316b from being punched through by an excessively strong electric field.

In an embodiment, the gate electrode 316a is a stack layer formed of conductive materials such as metal, polycrystalline silicon, doped polycrystalline silicon, polycrystalline metal silicide, or a combination thereof. The gate dielectric layer 316b is located between the gate electrode 316a and the substrate 10. The isolation structures 324a and 324b may be localized thermally oxidized isolation structures, for example, and a material of the isolation structures 324a and 324b includes an insulating material, such as silicon oxide.

From a perspective, such as a lateral perspective, the first top doped region 314 is of the second conductivity type and located in the first doped region 212 (or the substrate 10) between the drain 320 and the source 322. From another perspective, such as a vertical perspective, the top doped region 314 is located between the isolation structure 324a and the first doped region 212 (or the substrate 10). In an embodiment, a dopant concentration gradient of the first top doped region 314 near the gate structure 316 is different from the dopant concentration gradient of the first top doped region 314 near the drain 320. Specifically, the dopant concentration gradient in the first top doped region 314 may be linear. Namely, the dopant concentration of the first top doped region 314 linearly decreases from near the gate structure 316 toward near the drain 320. From another perspective, a doped depth of the first top doped region 314 gradually decreases from near the gate structure 316 to near the drain region 320. A profile of the bottom of the first top doped region 314 is substantially linear.

The source 322 is of the first conductivity type and located in the third doped region 332 at the end E2 of the gate structure 316. A dopant concentration of the source 322 is higher than a dopant concentration of the third doped region 332. As shown in FIG. 3, the source 322 surrounds the drain 320. More specifically, the source 322 surrounds a circumference of the first top doped region 314. The third doped region 332 is of the first conductivity type and located in the substrate 10. The third doped region 332 is a combination of one or more doped regions, for example. In an embodiment, the third doped region 332 is an N-type heavily doped drain (NHDD), an N-type doped drift EN-drift) region, or a combination thereof, for example.

In addition, the high voltage device 300 further includes a fourth doped region 240 and a fifth doped region 242. The fourth doped region 240 (e.g., a P-type high voltage well region) is of the second conductivity type and surrounds the high voltage device 300 and the junction field effect transistor 200. The fifth doped region 242 is of the second conductivity type and located in the fourth doped region 240. A dopant concentration of the fifth doped region 242 is higher than a dopant concentration of the fourth doped region 240, and the fifth doped region 242 may serve as a bulk region. In an embodiment, an isolation structure 324c may be provided between the fifth doped region 242 and the source 322 to be electrically isolated from each other.

In addition, the high voltage device 300 further includes metal interconnects 302 and 304 in a dielectric layer 312. More specifically, the metal interconnect 302 is located over the drain 320. The metal interconnect 304 is located over the source 322. In this embodiment, the metal interconnects 302 and 304 respectively cover a portion of the isolation structure 324a to prevent passivation and process contaminations, so as to increase the reliability of the device. At least one opening 308 is provided between the metal interconnect 302 and the metal interconnect 304. The opening 308 is located over the first top doped region 314. Moreover, in addition to serving as metal interconnects, the metal interconnects 302 and 304 over the isolation structure 324a may also serve as a field plate or a shielding layer. Thus, the metal interconnects 302 and 304 located over the isolation structure 324a may reduce a surface field to effectively increase the breakdown voltage and reduce the ON-state resistance. In an embodiment, the user may adjust the size of the opening 308 over the first top doped region 314 based on needs, so as to optimize the breakdown voltage and the ON-state resistance of the device. Even though the cross-sectional view of FIG. 4A does not illustrate electrical connections of the metal interconnects 302 and 304, the metal interconnect 302 may be electrically connected with the drain 320 and the metal interconnect 304 may be electrically connected with the source 322. In other embodiments, the metal interconnects 302 and 304 may also be electrically connected with other peripheral devices.

Referring to FIGS. 3 and 4B, the junction field effect transistor 200 is embedded in an opening of the fourth doped region 240. In other words, the junction field effect transistor 200 is located in the first doped region 212 between the fourth doped region 240 and the source 322. In an embodiment, the junction field effect transistor 200 includes the first doped region 212, a second top doped region 214, and a seventh doped region 204.

As shown in FIG. 4B, the first doped region 212 is located in the substrate 10, and the second top doped region 214, and the seventh doped region 204 are located in the first doped region 212. According to an embodiment, from a perspective, the first doped region (e.g., the first N-type well region) 212 extends from the high voltage device 300 to the junction field effect transistor 200. From another perspective, the first doped region 212 extends from lower sides of the drain 320 and the first top doped layer 314 to a lower side of the second top doped region 214. As shown in FIG. 3, the first doped region 212 below the drain 320 passes through the source 322, and then extends to the opening of the fourth doped region 240.

The second top doped region 214 is of the second conductivity type. The second top doped region 214 is located in the first doped region 212. The second top doped region 214 has a first side S1 and a second side S2. The second side S2 is closer to the first top doped region 314 than the first side S1. In an embodiment, the first side S1 of the second top doped region 214 is located below an isolation structure 224. In addition, the second top doped region 214 extends laterally, such that another side S2 is located below the isolation structure 324a. In other words, the second top doped region 214 partially overlaps with the isolation structure 224 and partially overlaps with the isolation structure 324a. In an embodiment, a dopant concentration gradient of the second top doped region 214 at the first side S1 is different from the dopant concentration gradient of the second top doped region 214 at the second side S2. As shown in FIG. 4B, the dopant concentration gradient in the second top doped region 214 may be linear. In other words, the dopant concentration of the second top doped region 214 linearly decreases from near the first side S1 to near the second side S2. From another perspective, a doped depth of the second top doped region 214 gradually decreases from near the first side S1 to near the second side S2, and a profile of the bottom of the second top doped region 214 is substantially linear.

In alternative embodiments, the dopant concentration gradient of the second top doped region 214 at a first side S1 and the dopant concentration of the second top doped region 214 at a second side S2 may be the same. That is to say, a bottom surface of the second top doped region 214 is parallel to a bottom surface of the first doped region 212.

The seventh doped region 204 is of the first conductivity type, and located in the first doped region 212. The seventh doped region 204 is located beside the second top doped region 214. In an embodiment, the isolation structure 224 is provided between the second top doped region 214 and the seventh doped region 204.

By adjusting the dopant concentration gradient of the second top doped region 214 of the junction field effect transistor 200, a pinch-off voltage of the junction field effect transistor 200 of this embodiment may be adjusted, so as to reduce the leakage current and increase the breakdown voltage.

Figure 5:
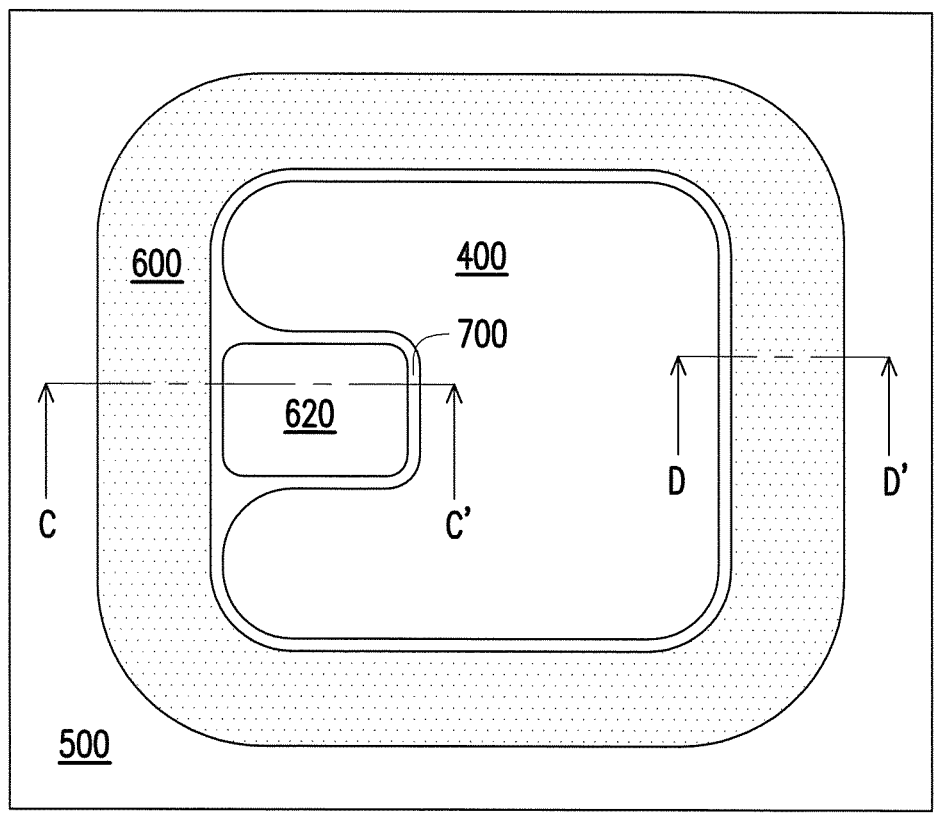
FIG. 5 is a top view illustrating a semiconductor device according to a third embodiment of the present disclosure.
Figure 6A:
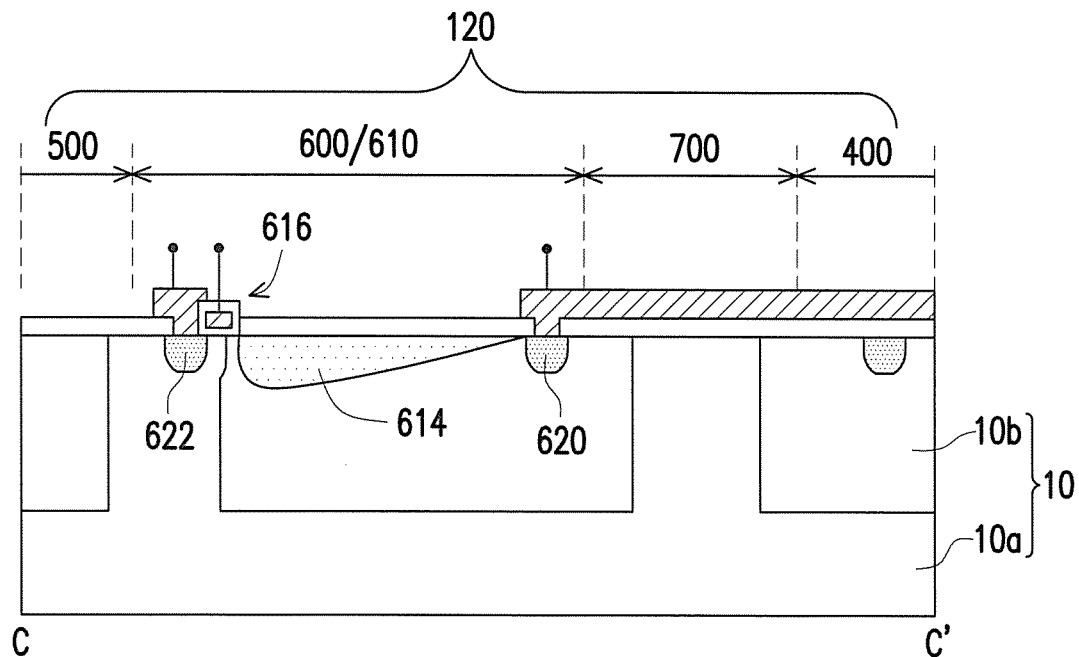
FIG. 6A is a cross-sectional view taken along a cross-sectional line C-C' of FIG. 5.
Figure 6B:
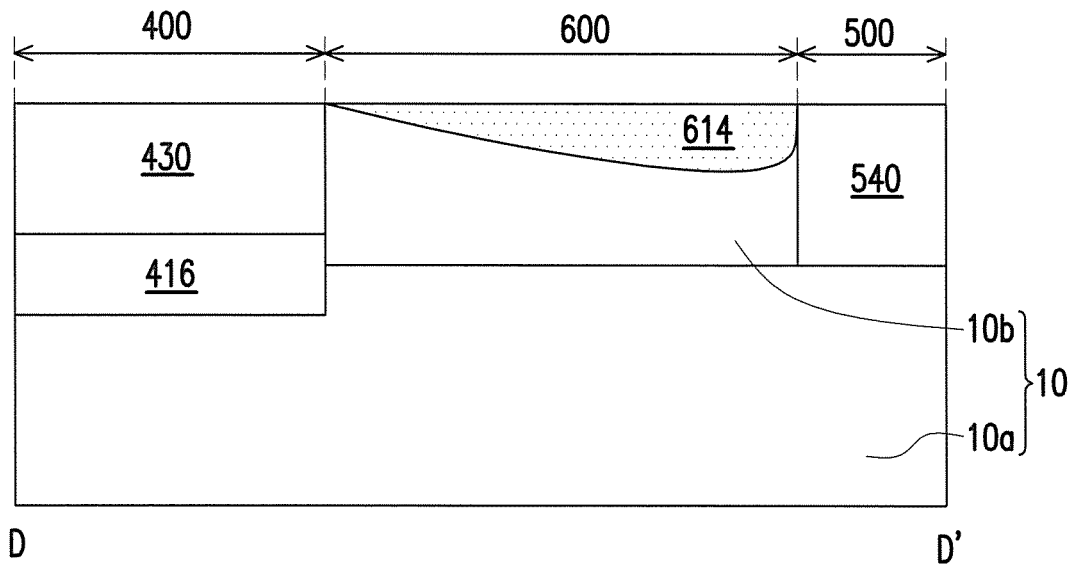
FIG. 6B is a cross-sectional view taken along a cross-sectional line D-D' of FIG. 5.

FIG. 5 is a top view illustrating a semiconductor device according to a third embodiment of the present disclosure. FIG. 6A is a cross-sectional view taken along a cross-sectional line C-C' of FIG. 5. FIG. 6B is a cross-sectional view taken along a cross-sectional line D-D' of FIG. 5. For the ease of illustration, only the substrate, the high voltage device region, the low voltage device region, a termination region, an isolation region, and a drain are illustrated in FIG. 5.

Referring to FIG. 5, a semiconductor device 120 includes the substrate 10. The substrate 10 has a high voltage device region 400, a low voltage device region 500, a termination region 600, and an isolation region 700. The termination region 600 is located between the high voltage device region 400 and the low voltage device region 500. More specifically, the termination region 600 surrounds the high voltage device 400. In an embodiment, the substrate 10 may also include the semiconductor substrate 10a and the epitaxial layer 10b over the semiconductor substrate 10a. The substrate 10 may be a substrate doped with a dopant of a second conductivity type, and the epitaxial layer 10b may be an epitaxial layer of the first conductivity type. In this embodiment, the semiconductor substrate 10a is a P-type substrate, and the epitaxial layer 10b may be an N-type epitaxial layer.

Referring to FIGS. 5 and 6A, a metal oxide semiconductor field effect transistor (MOSFET) 610 is located at a side of the high voltage device region 400 (or the isolation region 700), and the MOSFET 610 located between the high voltage device region 400 (or the isolation region 700) and the low voltage device region 500. The MOSFET 610 includes a drain 620 of the first conductivity type, a source 622 of the first conductivity type, a gate structure 616, and a top doped region 614 of the second conductivity type. The drain 620 is in the substrate 10 near the isolation region 700 (or the high voltage device region 400). The source region 622 is located in the substrate 10 near the low voltage device region 500. The gate structure 616 is located over the substrate 10 between the source 622 and the drain 620. The gate structure 616 may include a gate dielectric layer and a gate electrode.

The top doped region 614 is located in the substrate 10 between the drain 620 and the gate structure 616. In an embodiment, a dopant concentration gradient of the top doped region 614 near the gate structure 616 is different from the dopant concentration gradient of the top doped region 614 near the drain 620. Specifically, the dopant concentration gradient in the top doped region 614 may be linear. Namely, the dopant concentration of the top doped region 614 linearly decreases from near the gate structure 616 toward near the drain 620. From another perspective, a doped depth of the top doped region 614 gradually decreases from near the gate structure 616 to near the drain region 620. A profile of the bottom of the top doped region 614 is substantially linear.

It should be noted that, in an embodiment, the MOSFET 610 may be a level shifter, for example, and is capable of electrically shifting a lower voltage signal to a higher voltage, so as to form a bridge between the high voltage device region 400 and the low voltage device region 500. In this embodiment, by adjusting the dopant concentration gradient of the top doped region 614, an electric field distribution in the device may be changed to provide a reduced surface field (RESURF). Accordingly, the top doped region 614 of this embodiment may increase a breakdown voltage of the semiconductor device 120.

The isolation region 700 is located between the drain 620 (or the MOSFET 610) and the high voltage device region 400. In an embodiment, the isolation region 700 may be an isolation structure formed by a localized oxidation (LOCOS) structure, a shallow trench isolation (STI) structure, a well region, or a combination thereof.

Referring to FIGS. 5 and 6B, the high voltage device region 400 further includes a buried layer 416 of the first conductivity type and a doped region 430 of the first conductivity type. The buried layer 416 (e.g., an N-type buried layer) is located between the semiconductor substrate 10a and the doped region 430. In an embodiment, a dopant concentration of the buried layer 416 may be greater than a dopant concentration of the doped region 430.

The low voltage device region 500 further includes a doped region 540 of a second conductivity type (e.g., a P-type high voltage well region). The doped region 540 is located in the epitaxial layer 10b on the semiconductor substrate 10a. In another embodiment, the doped region 540 is located beside the top doped region 614.

From another perspective, the top doped region 614 is located in the epitaxial layer 10b between the doped region 540 and the doped region 430. In an embodiment, the dopant concentration gradient of the top doped region 614 near the doped region 540 is different from the dopant concentration gradient of the top doped region 614 near the doped region 430. Specifically, the dopant concentration gradient in the top doped region 614 may be linear. Namely, the dopant concentration of the top doped region 614 linearly decreases from near the doped region 540 toward near the doped region 430. In other words, the dopant concentration of the top doped region 614 gradually decreases from near the doped region 540 to near the doped region 430.

In view of the foregoing, different dopant concentration gradients are designed for the diode, junction field effect transistor, and semiconductor device according to the embodiments of the present disclosure based on the different top doped regions, so as to prevent current accumulation in the device and thereby increase the breakdown voltage and reduce the ON-state resistance of the device. In addition, the embodiments of the present disclosure include the metal interconnects over the top doped region to prevent passivation or process contaminations, so as to increase the reliability of the device. The metal interconnect may also serve as a field plate capable of reducing the surface field to effectively reduce the ON-state resistance.

Moreover, according to the embodiments of the present disclosure, a bootstrap circuit may be integrated into the conventional integrated circuit manufacturing process without modifying the conventional process or adding a photomask. Also, a charge balance in the high voltage device is maintained and the breakdown voltage of the high voltage device is increased. Accordingly, the reliability of the device is thus increased.

Furthermore, the linear top doped region according to the embodiments of the present disclosure may also be used in the junction field effect transistor, the level shifter, or other suitable high voltage devices, so as to increase the breakdown voltage of the high voltage device as well as the reliability of the product.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

What is claimed is:

1. A junction field effect transistor, comprising:
   a well region of a first conductivity type, located in a substrate of a second conductivity type;
   an isolation structure, located at a top surface of the well region; and
   a top doped region of the second conductivity type, located in the well region, wherein the top doped region has a dopant concentration gradient, the dopant concentration gradient of the top doped region at a first side is different from the dopant concentration gradient of the top doped region at a second side, and a part of a surface of the top doped region is exposed by the isolation structure.

2. The junction field effect transistor as claimed in claim 1, wherein the dopant concentration gradient gradually decreases from near the first side to near the second side.

3. The junction field effect transistor as claimed in claim 1, wherein the top doped region includes a doping depth, and the doping depth of the top doped region near the first side is different from the doping depth of the top doped region near the second side.

4. The junction field effect transistor as claimed in claim 3, wherein the doping depth gradually decreases from near the first side to near the second side.

5. The junction field effect transistor as claimed in claim 1, further comprising:
   a second doped region of the first conductivity type, located in the well region at the first side of the top doped region.

6. A semiconductor device comprising:
   a high voltage device, comprising:
      a drain region of a first conductivity type, located in a substrate of a second conductivity type;
      a source region of the first conductivity type, located in the substrate and surrounding the drain region;
      a gate structure, located over the substrate between the drain region and the source region; and
      a first top doped region of the second conductivity type, located in the substrate between the drain region and the gate structure, wherein the first top doped region has a first dopant concentration gradient, the first dopant concentration gradient of the first top doped region near the gate structure is different from the first dopant concentration gradient of the first top doped region near the drain region; and
   a junction field effect transistor, embedded in the high voltage device, comprising:
      a well region of the first conductivity type, located in the substrate; and
      a second top doped region of the second conductivity type, located in the well region.

7. The semiconductor device as claimed in claim 6, wherein the second top doped region has a second dopant concentration gradient, the second dopant concentration gradient of the second top doped region at a first side and the second dopant concentration of the second top doped region at a second side are substantially the same.

8. The semiconductor device as claimed in claim 6, wherein the second top doped region has a second dopant concentration gradient, the second dopant concentration gradient of the second top doped region at a first side is different from the second dopant concentration of the second top doped region at a second side, wherein the second side is closer to the first top doped region than the first side.

9. The semiconductor device as claimed in claim 8, wherein the first dopant concentration gradient gradually decreases from near the gate structure to near the drain region.

10. The semiconductor device as claimed in claim 8, wherein the second dopant concentration gradient gradually decreases from near the first side to near the second side.

11. The semiconductor device as claimed in claim 6, wherein the well region extends below the drain region and the first top doped region.

12. The semiconductor device as claimed in claim 6, further comprising: a high voltage well region of the second conductivity type located in the substrate, wherein the high voltage well region surrounds the high voltage device and the junction field effect transistor.

* * * * *